United States Patent
Han

(10) Patent No.: US 8,278,614 B2
(45) Date of Patent: Oct. 2, 2012

(54) IMAGE SENSOR AND METHOD FOR MANUFACTURING THE SAME

(75) Inventor: Chang-Hun Han, Anyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 544 days.

(21) Appl. No.: 12/576,489

(22) Filed: Oct. 9, 2009

(65) Prior Publication Data

US 2010/0090095 A1  Apr. 15, 2010

(30) Foreign Application Priority Data

Oct. 9, 2008 (KR) .......... 10-2008-0099081
Oct. 15, 2008 (KR) .......... 10-2008-0101168
Oct. 15, 2008 (KR) .......... 10-2008-0101174

(51) Int. Cl.
*H01L 31/02* (2006.01)

(52) U.S. Cl. ........... 250/214 R; 250/214.1; 250/208.1; 257/E21.585; 438/98

(58) Field of Classification Search ........... 250/214 R, 250/214.1, 208.1; 257/E21.585, E31.113; 438/98

See application file for complete search history.

(56) References Cited

U.S. PATENT DOCUMENTS 7,820,525 B2 * 10/2010 Hsieh ............... 438/455
7,883,913 B2 * 2/2011 Kim ............... 438/29
7,948,015 B2 * 5/2011 Rothberg et al. ........... 257/253

FOREIGN PATENT DOCUMENTS

JP 2008-227253 9/2008
KR 10-2006-0120260 11/2006

* cited by examiner

*Primary Examiner* — Seung C Sohn
(74) *Attorney, Agent, or Firm* — Sherr & Jiang, PLLC

(57) ABSTRACT

An image sensor and a method of manufacturing an image sensor. An image sensor may include a readout circuitry having a metal line on and/or over a first substrate. An image sensor may include an image sensing part having a first conductive-type conductive layer and/or a second conductive-type conductive layer over a metal line. An image sensor may include a pixel division area formed on and/or over an image sensing part corresponding to a pixel boundary. An image sensor may include a ground contact on and/or over a pixel division area. An image sensor may include a contact plug connected with a sidewall of an image sensing part. A method of manufacturing an image sensor is disclosed.

20 Claims, 16 Drawing Sheets

IMAGE SENSOR AND METHOD FOR MANUFACTURING THE SAME

The present application claims priority under 35 U.S.C. 119 to Korean Patent Application No. 10-2008-0099081 (filed on Oct. 9, 2008), Application No. 10-2008-0101174 (filed on Oct. 15, 2008) and Application No. 10-2008-0101168 (filed on Oct. 15, 2008), which are hereby incorporated by references in their entirety.

BACKGROUND

Embodiments relate to an electric device and methods thereof. Some embodiments relate to an image sensor and methods of manufacturing an image sensor.

A photodiode (PD) may be formed by implanting ions into a substrate. As the size of a PD is relatively decreased such that the number of pixels is relatively increased substantially without the increase of a chip size, image quality may be relatively degraded due to an area reduction of a light receiving part. A stack height may not be decreased relative to an area reduction of a light receiving part and the number of photons input into a light receiving part may be relatively decreased due to a diffraction of light called "Airy Disk".

A PD may be deposited using amorphous silicon (Si). A readout circuitry may be formed on and/or over a Si-substrate through a wafer-to-wafer bonding scheme. A PD may be formed on and/or over a readout circuitry, which may reference a three-dimensional (3-D) image sensor. A PD may be connected to a readout circuitry through a metal line.

After two wafers have been bonded to each other, a process of forming a signal line may be required with respect to a wafer having a photodiode thereover. Although a 3-D device may be realized, light loss may occur due to light reflection caused by a metal line. A ground contact may be formed at a predetermined area of an upper portion of a photodiode. However, a metal line may be required for connection of a ground contact. Since a metal line may cause light reflection, light loss may occur.

Accordingly, there is a need for an image sensor and a method of manufacturing an image sensor which may minimizing light loss, for example by maximizing formation of a signal line.

SUMMARY

Embodiments relate to an image sensor and a method of manufacturing an image sensor. According to embodiments, an image sensor and a method of manufacturing an image sensor may minimize light loss, for example by maximizing formation of a signal line.

Embodiments relate to an image sensor. According to embodiments, an image sensor may include a readout circuitry. In embodiments, a readout circuitry may include a metal line over a first substrate. In embodiments, an image sensor may include an image sensing part. In embodiments, an image sensing part may include a first conductive-type conductive layer and/or a second conductive-type conductive layer on and/or over a metal line. In embodiments, an image sensor may include a pixel division area. In embodiments, a pixel division area may be formed on and/or over an image sensing part which may correspond to a pixel boundary. In embodiments, an image sensor may include a ground contact on and/or over a pixel division area.

Embodiments relate to a method of manufacturing an image sensor. According to embodiments, a method of manufacturing an image sensor may include forming a readout circuitry, which may include a metal line on and/or over a first substrate. In embodiments, a method of manufacturing an image sensor may include forming an image sensing part, which may include a first conductive-type conductive layer and/or a second conductive-type conductive layer on and/or over a metal line. In embodiments, a method of manufacturing an image sensor may include forming a pixel division area on and/or over an image sensing part, which may correspond to a pixel boundary. In embodiments, a method of manufacturing an image sensor may include forming a ground contact on and/or over a pixel division area.

According to embodiments, an image sensor and a method of manufacturing an image sensor may minimize light loss by maximizing formation of a signal line. In embodiments, an image sensor and a method of manufacturing an image sensor may include a minimized resistance of a signal line connected to a photodiode, for example in a 3-D image sensor, such that relative sensitivity of an image sensor may be maximized. In embodiments, an image sensor and a method of manufacturing an image sensor may maximize a dark current characteristic by minimizing a damaged area of a photodiode.

Embodiments relate to an image sensor. According embodiments, an image sensor may include a readout circuitry which may have a metal line on and/or over a first substrate. In embodiments, an image sensor may include an image sensing part, which may have a first conductive-type conductive layer and/or a second conductive-type conductive layer on and/or over a metal line. In embodiments, an image sensor may include a contact plug which may be connected to a sidewall of an image sensing part.

Embodiments relate to manufacturing an image sensor. According embodiments, a method of manufacturing an image sensor may includes forming a readout circuitry, which may include a metal line on and/or over a first substrate. In embodiments, a method of manufacturing an image sensor may include forming an image sensing part, which may include a first conductive-type conductive layer and/or a second conductive-type conductive layer on and/or over a metal line. In embodiments, a method of manufacturing an image sensor may include forming a contact plug, which may be connected to a sidewall of an image sensing part.

According to embodiments, an image sensor and a method of manufacturing an image sensor may minimize light loss by maximizing formation of a signal line. In embodiments, an image sensor and a method of manufacturing an image sensor may minimize resistance of a signal line connected to a photodiode, for example in a 3-D image sensor, such that sensitivity of the image sensor may be maximized. In embodiments, an image sensor and a method of manufacturing an image sensor may maximize a dark current characteristic by minimizing a damaged area of a photodiode.

Embodiments relate to an image sensor. According embodiments, an image sensor may include a readout circuitry, which may include a metal line on and/or over a first substrate. In embodiments, an image sensor may include an image sensing part, which may include a first conductive-type conductive layer and/or a second conductive-type conductive layer on and/or over a metal line. In embodiments, an image sensor may include a contact plug, which may be connected to a sidewall of the image sensing part.

Embodiments relate to a method of manufacturing an image sensor. According embodiments, a method of manufacturing an image sensor may include forming a readout circuitry, which may including a metal line on and/or over a first substrate. In embodiments, a method of manufacturing an image sensor may include forming an image sensing part, which may including a first conductive-type conductive layer and/or a second conductive-type conductive layer on and/or over a metal line. In embodiments, a method of manufacturing an image sensor may include forming a contact plug, which may be connected to a sidewall of the image sensing part.

According to embodiments, for an image sensor and a method of manufacturing an image sensor, the position of a contact formed on and/or over a photodiode for ground-connection may be changed to a sidewall of a pixel division area. In embodiments, light loss caused by a contact may be minimized. In embodiments, formation of a signal line may be maximized.

According to embodiments, only one part may subject to a Si-etching process in contrast to when two parts are subject to a Si-etching process. In embodiments, light loss and dark current may be minimized.

According to embodiments, a signal contact of an upper photodiode may be formed on and/or over a lower portion, which may be a substantially whole lower portion, of a pixel division area instead of a central portion of a pixel. In embodiments, a contact area may be maximized such that resistance is minimized, thereby maximizing sensitivity of an image sensor.

DRAWINGS

DESCRIPTION

Figure 1:
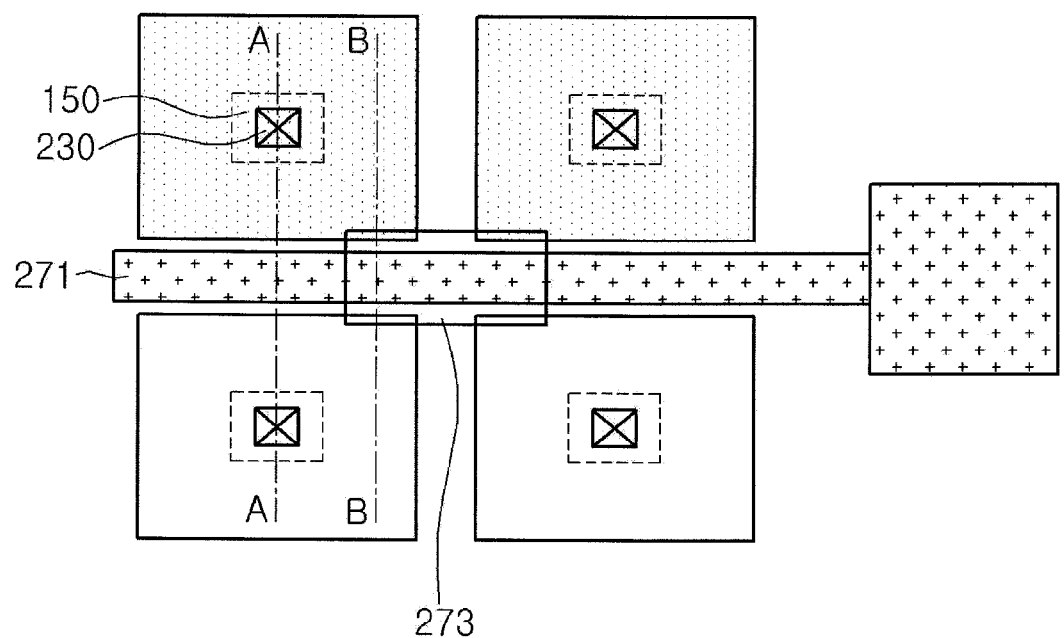
FIG. 1 is a plan view illustrating an image sensor in accordance with embodiments.

Embodiments relate to an image sensor and a method of manufacturing an image sensor. According to embodiments, embodiments are not limited to a CMOS image sensor and may be adapted to an image sensor requiring a photodiode. Referring to example FIG. 1, a plan view illustrates an image sensor in accordance with embodiments. Referring to example FIG. 2, a sectional view taken along line A-A is illustrated. Referring to example FIG. 3, a sectional view taken along line B-B is illustrated.

According to embodiments, an image sensor may include a readout circuitry formed on and/or over a first substrate. In embodiments, an image sensor may include metal line 150. In embodiments, an image sensor may include image sensing part 210 formed on and/or over metal line 150. In embodiments, image sensing part 210 may include first conductive-type conductive layer 214 and/or second conductive-type conductive layer 216. In embodiments, an image sensor may include pixel division area 250, which may be placed at a boundary of a pixel and which may be formed on and/or over image sensing part 210. In embodiments, an image sensor may include a ground contact 273, which may be formed on and/or over pixel division area 250.

According to embodiments, a position of a ground contact formed on and/or over a photodiode for the purpose of a ground-connection may be changed to a sidewall of a pixel division area. In embodiments, light loss caused by a ground contact may be minimized. In embodiments, formation of a signal line may be maximized.

Figure 2:
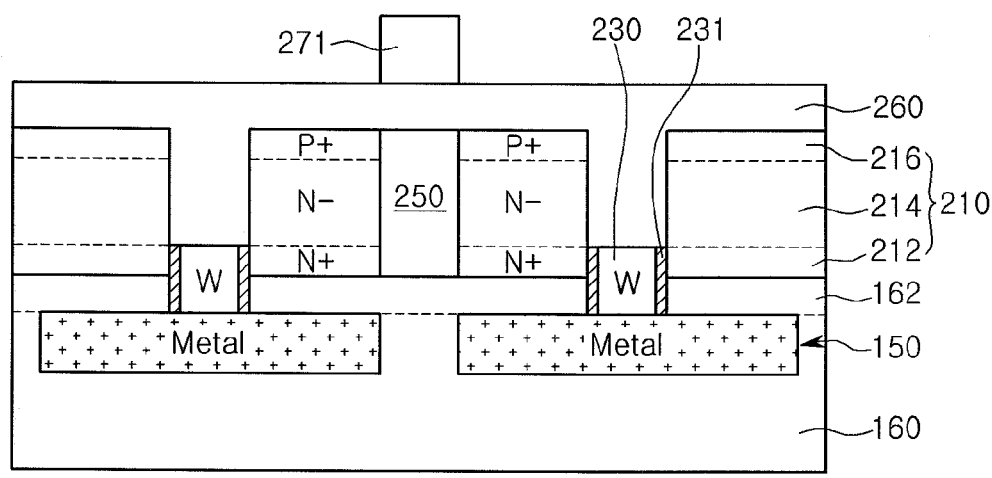
FIG. 2 is a sectional view taken along line A-A of an image sensor in accordance with embodiments.

Referring to FIG. 2, a sectional view taken along line A-A is illustrated. According to embodiments, an image sensing part 210 may be formed on and/or over metal line 150. In embodiments, a readout circuitry may include metal line 150 and may be formed on and/or over a first substrate. In embodiments, a readout circuitry may include a transfer transistor, a reset transistor, a drive transistor and/or a select transistor, but embodiments are not limited thereto.

According to embodiments, metal line 150 may be electrically connected to a readout circuitry, and may be formed on and/or over first interlayer dielectric layer 160. In embodiments, metal line 150 may be formed after forming first interlayer dielectric layer 160 on and/or over a first substrate. In embodiments, a second interlayer dielectric layer 162 may be formed on and/or over metal line 150.

According to embodiments, first and/or second conductive-type conductive layers 214 and 216, respectively, may be formed through an ion implantation process, and may be formed after forming a crystal semiconductor layer on and/or over a second substrate. In embodiments, high-concentration first conductive-type conductive layer 212 may be formed, for example under first conductive-type conductive layer 214, and may serve as an ohmic contact layer.

According to embodiments, a first substrate may be bonded to a second substrate such that metal line 15 may correspond to image sensing device 210. In embodiments, a second substrate may be removed from the resultant structure except for image sensing part 210.

According to embodiments, a trench may be formed to expose metal line 150 by removing a portion of image sensing part 210. In embodiments, a metallic layer may be filled on and/or over a trench. In embodiments, a portion of a metallic layer contacting second conductive-type conductive layer 216 may be removed to form contact plug 230. In embodiments, first insulating layer 260 may be formed on and/or over contact plug 230. In embodiments, barrier metal 231 may be formed between contact plug 230 and image sensing part 210.

According to embodiments, a portion of image sensing part 210 may be removed from a pixel boundary. In embodiments, an insulating layer may be filled in the removed area, thereby forming pixel division area 250. In embodiments, ground line 271 may be formed on and/or over pixel division area 250, for example by using a metallic layer.

According to embodiments, contact plug 230 may directly connect metal line 150 to image sensing part 210 such that signals can more effectively be transmitted. In embodiments, contact plug 230 may be removed from second conductive-type conductive layer 216, such that a short may be minimized.

Figure 3:
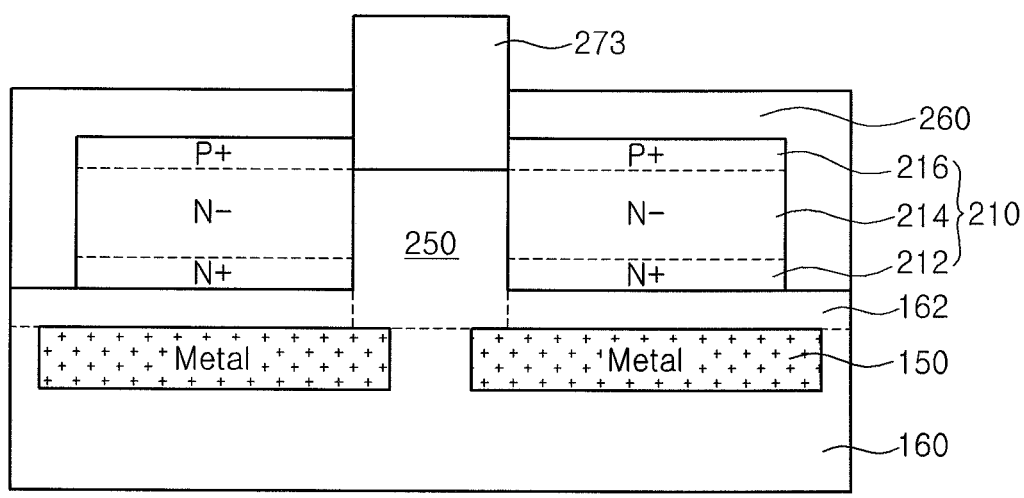
FIG. 3 is a sectional view taken along line B-B of an image sensor in accordance with embodiments.
Figure 4:
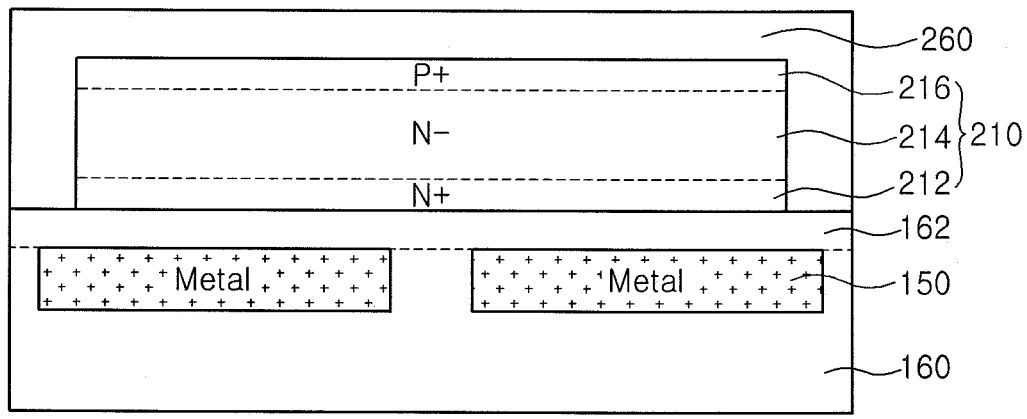
FIG. 4 to FIG. 12 are sectional views illustrating a method of manufacturing an image sensor in accordance with embodiments.

Referring to example FIG. 3, a sectional view taken along line B-B is illustrated. According to embodiments, ground contact 273 may be formed at a pixel boundary, for example as illustrated in FIG. 3 and with reference to example FIG. 4 to FIG. 12. Referring to FIG. 4, image sensing part 210 may be formed on and/or over metal line 150. In embodiments, first insulating layer 260 may have been formed on and/or over image sensing part 210.

Figure 5:
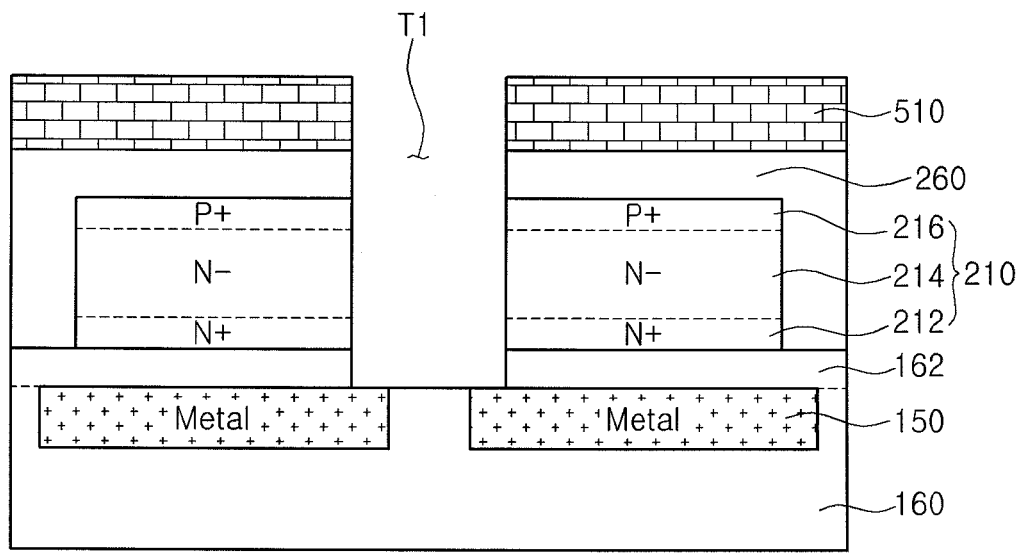
Figure 6:
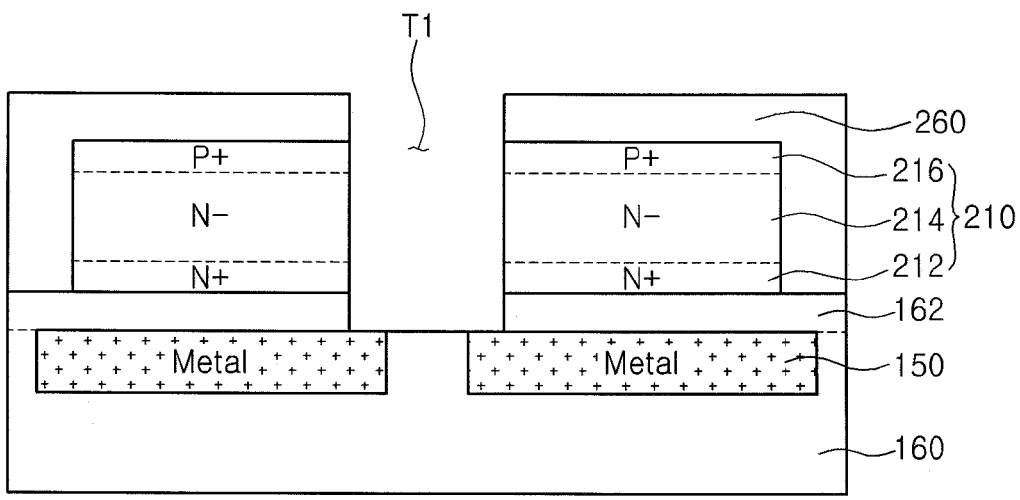
Figure 7:
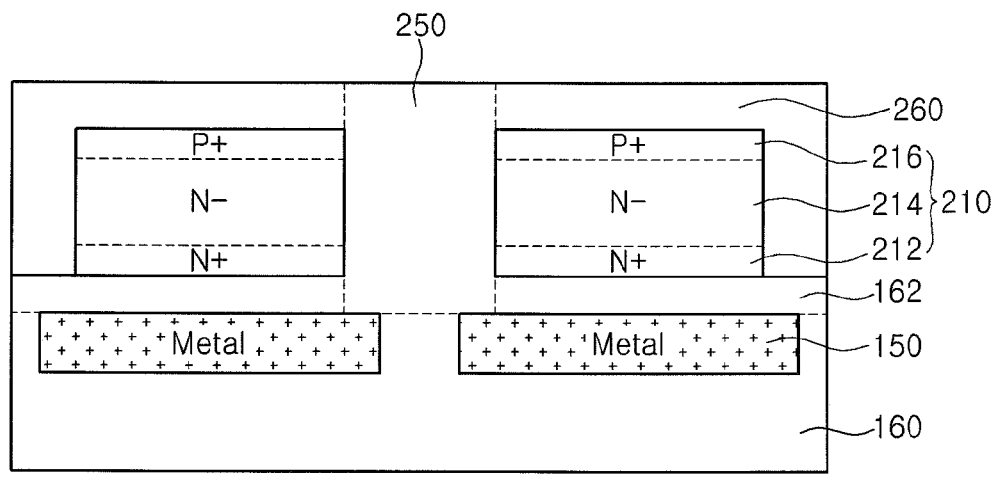

Referring to example FIG. 5, pixel division area 250 may be formed on and/or over image sensing part 210. In embodiments, image sensing part 210 corresponding to a pixel boundary may be removed, for example using first photoresist layer 510 as an etch mask, thereby forming first trench T1. Referring to example FIG. 6, first photoresist layer 510 may be removed. Referring to FIG. 7, pixel division area 250 may be formed on and/or over trench T1 as an insulating layer.

Figure 8:
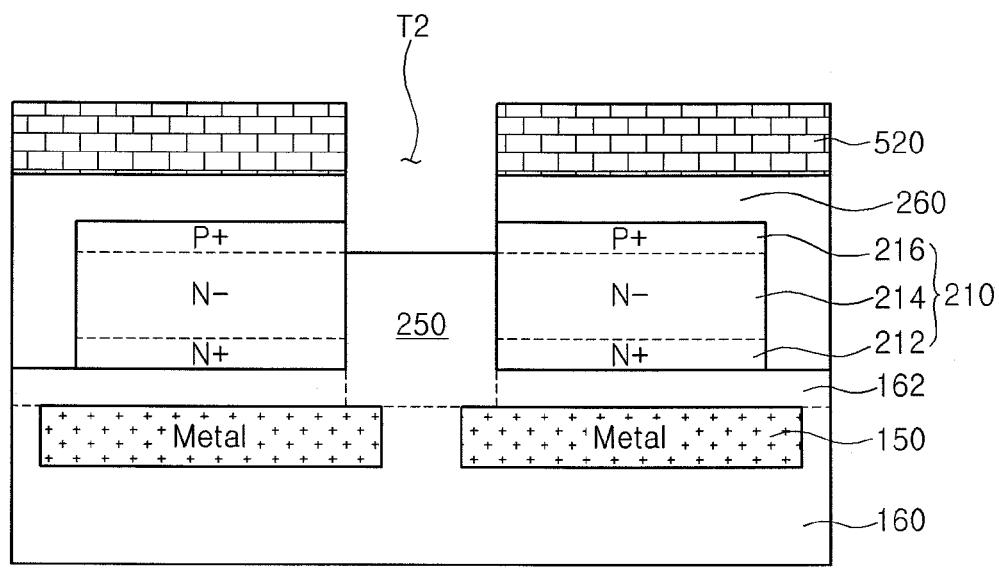
Figure 9:
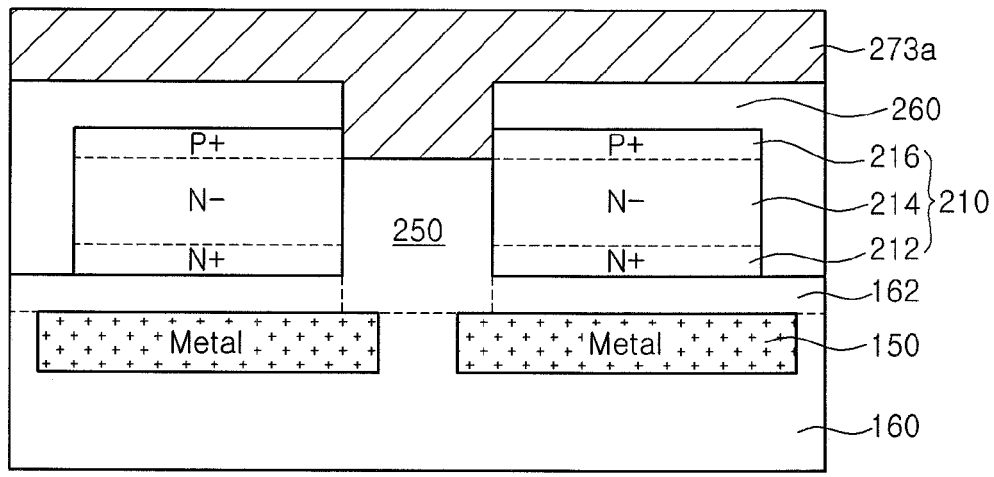

Referring to example FIG. 8, a portion of pixel division area 250 may be removed, for example using second photoresist layer 520 as an etching mask, thereby forming second trench T2 to expose a lateral side of second conductive-type conductive layer 216 of image sensing part 210. In embodiments, first conductive-type conductive layer 214 may not be exposed. Referring to FIG. 9, metal layer 273a may be formed on and/or over second trench T2 for a ground contact.

Figure 10:
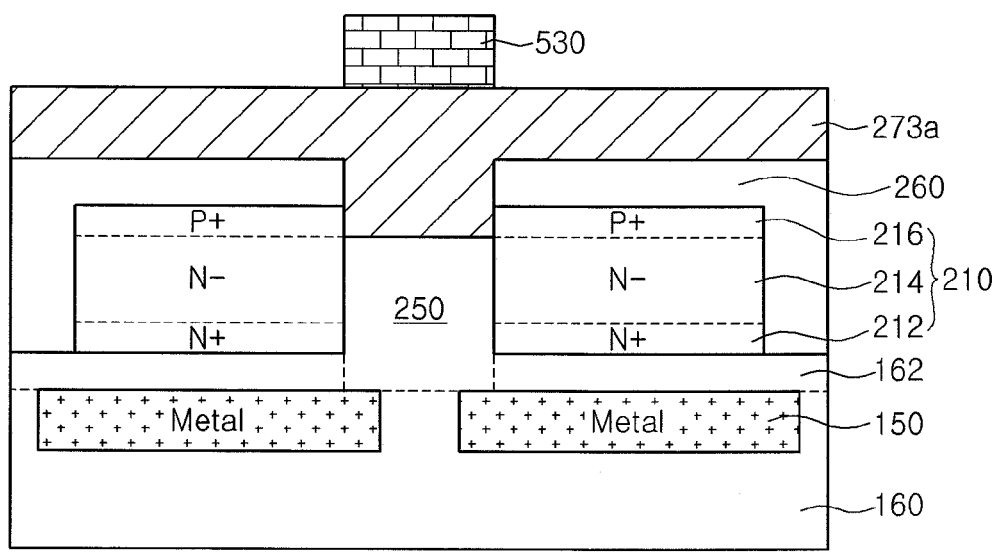
Figure 11:
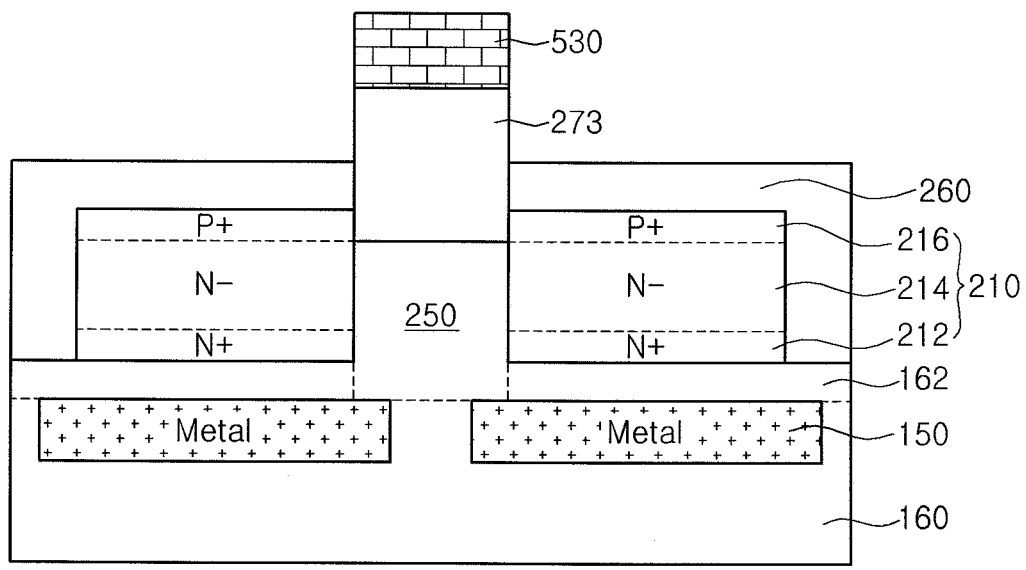
Figure 12:
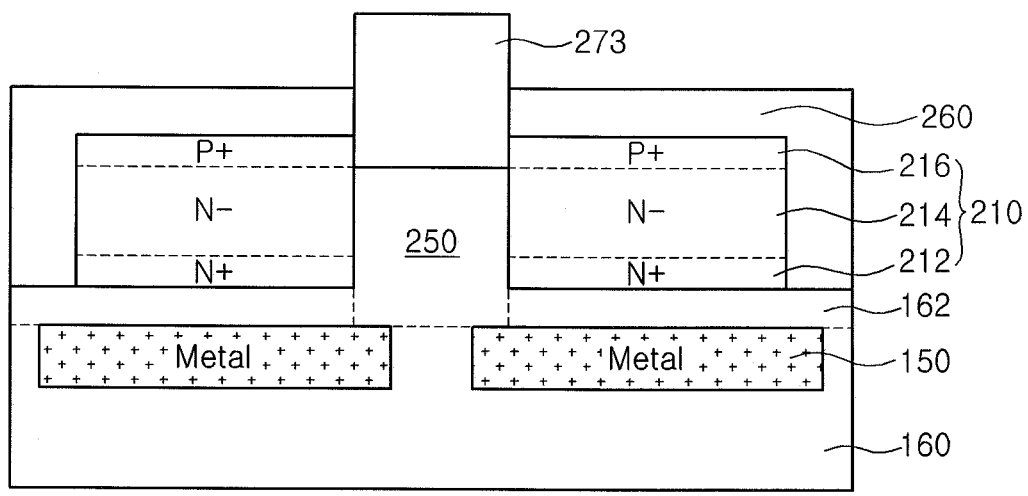

Referring to example FIG. 10, photoresist layer 530 may be formed on and/or over metal layer 273a such that metal layer 273a corresponding to pixel division area 250 may not be exposed. Referring to example FIG. 11, metal layer 273a may be etched, for example using third photoresist layer 530 as an etching mask, thereby forming ground contact 273 making contact with a lateral side of second conductive-type conductive layer 216. Referring to example FIG. 12, third photoresist layer 530 may be removed to form ground contact 273, for example as illustrated in FIG. 3 on and/or over a pixel boundary.

According to embodiments, an image sensor and a method of manufacturing an image sensor may include a position of a ground contact formed on and/or over a photodiode for the purpose of ground-connection which may be changed to a sidewall of a pixel division area. In embodiments, light loss caused by a ground contact may be minimized. In embodiments, formation of a signal line may be maximized.

Figure 13:
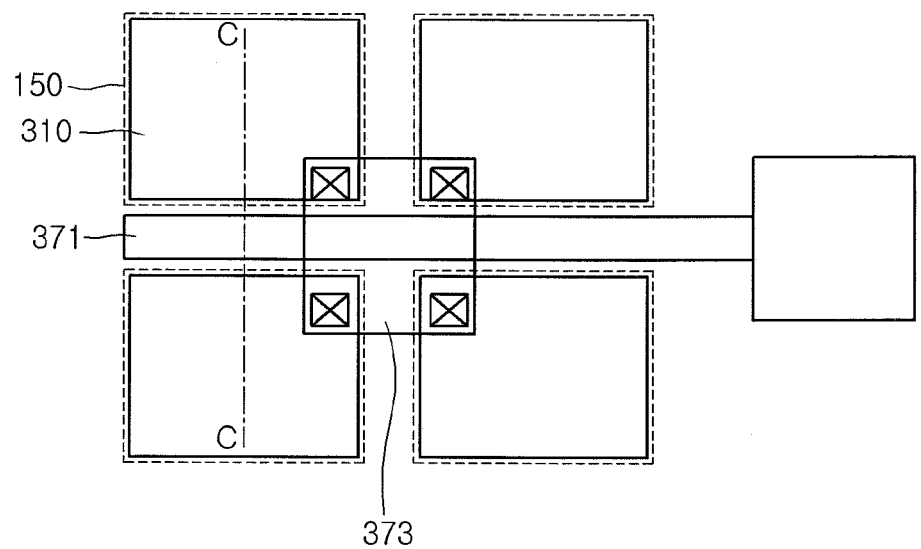
FIG. 13 is a plan view illustrating an image sensor an image sensor in accordance with embodiments.
Figure 14:
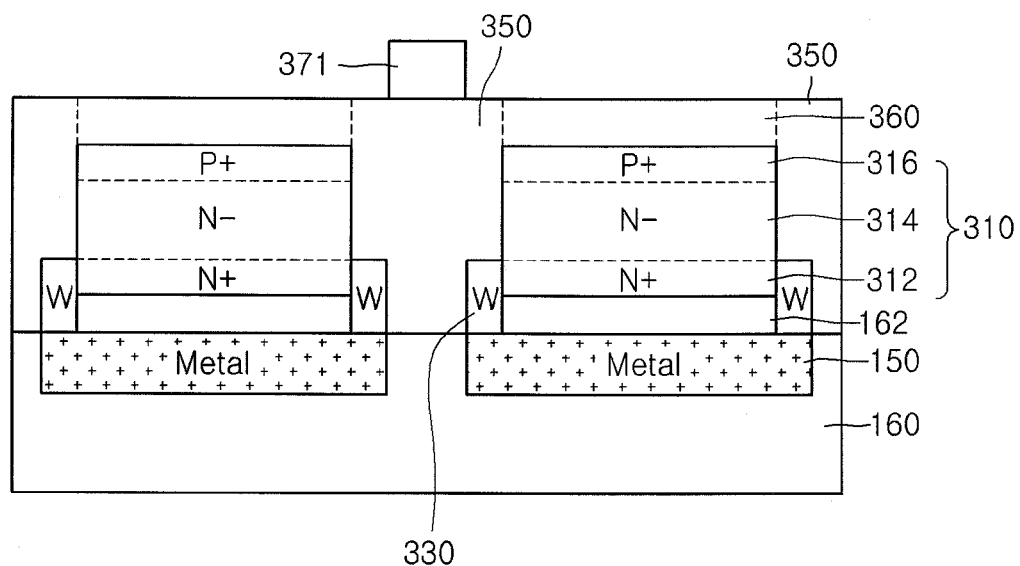
FIG. 14 is a sectional view taken along line C-C of an image sensor in accordance with embodiments.

Embodiments relate to an image sensor. Referring to example FIG. 13, a plan view illustrates an image sensor in accordance with embodiments. Referring to example FIG. 14, a sectional view taken along line C-C is illustrated.

According to embodiments, an image sensor may include a readout circuitry, which may be formed on and/or over a first substrate. In embodiments, an image sensor may include a metal line 150. In embodiments, an image sensor may include an image sensing part 310. In embodiments, image sensing part 310 may be formed on and/or over metal line 150. In embodiments, image sensing part 310 may include first conductive-type conductive layer 314 and/or a second conductive-type conductive layer 316. In embodiments, a contact plug 330 may be connected to a sidewall of image sensing part 310.

According to embodiments, only one part may subject to a Si-etching process in contrast to when two parts are subject to a Si-etching process. In embodiments, light loss and dark current may be minimized. In embodiments, a signal contact of an upper photodiode may be formed on and/or over a portion, which may be a substantially whole lower portion, of a pixel division area instead of a central portion of a pixel. In embodiments, a contact area may be maximized such that resistance may be minimized. In embodiments, sensitivity of an image sensor may be maximized.

Figure 15:
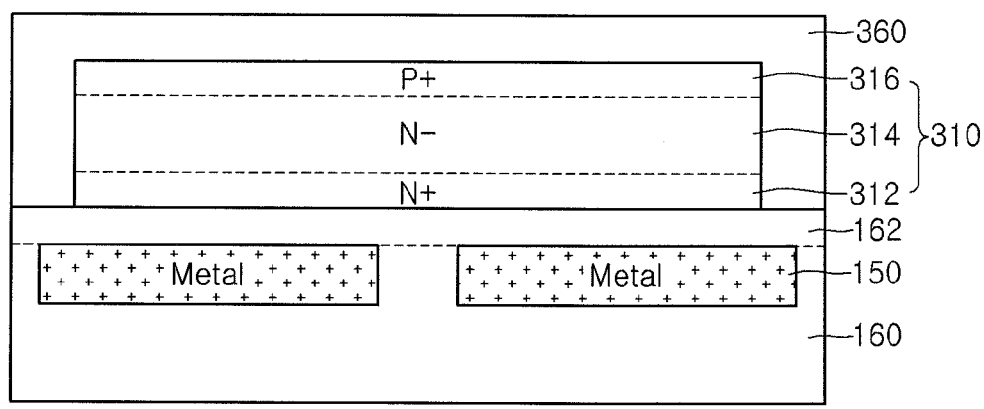
FIG. 15 to FIG. 20 are sectional views illustrating a method of manufacturing an image sensor in accordance with embodiments.

Embodiments relate to a method of manufacturing an image sensor. Referring to example FIG. 15, an image sensing part 310 may be formed on and/or over metal line 150. According to embodiments, a method of manufacturing an image sensor may include forming a readout circuitry which may include metal line 150 on and/or over a first substrate. In embodiments, a readout circuitry may include a transfer transistor, a reset transistor, a drive transistor and/or a select transistor, but the embodiment is not limited thereto.

According to embodiments, first interlayer dielectric layer 160 may be formed on and/or over a first substrate. In embodiments, metal line 150 may be formed, and may be electrically connected to readout circuitry, on and/or over first interlayer dielectric layer 160. In embodiments, second interlayer dielectric layer 162 may be formed on and/or over metal line 150.

According to embodiments, a crystal semiconductor layer may be formed on and/or over a second substrate. In embodiments, first and/or second conductive-type conductive layers 314 and 316, respectively, may be formed, for example through an ion implantation process. In embodiments, high-concentration first conductive-type conductive layer 312 may be formed, for example under first conductive-type conductive layer 314, and may serve as an ohmic contact layer. In embodiments, the first substrate may be bonded to the second substrate such that metal line 15 may correspond to image sensing device 310. In embodiments, the second substrate may be removed from the resultant structure except for image sensing part 310. In embodiments, first insulating layer 360 may be formed on and/or over image sensing part 310.

Figure 16:
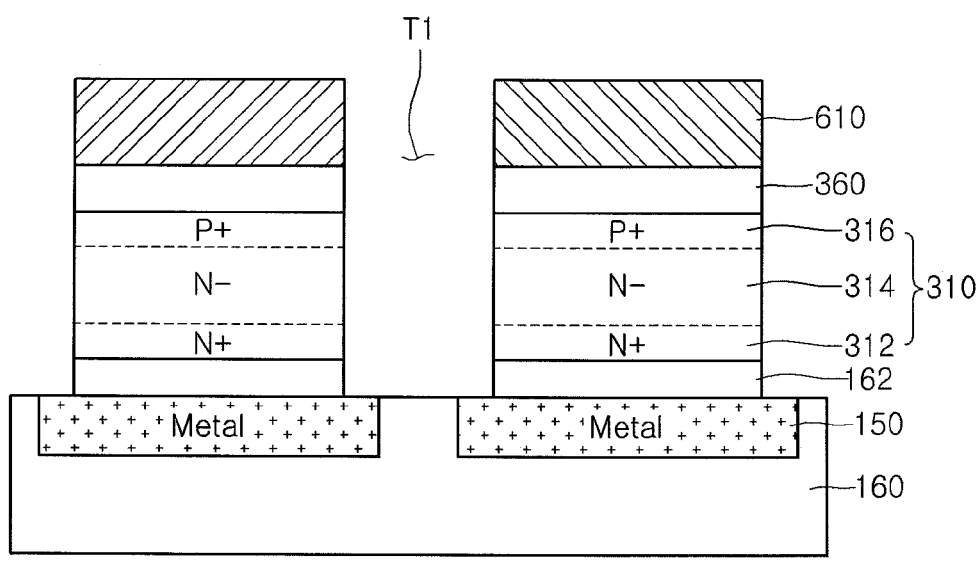

Referring to example FIG. 16, first trench T1 may be formed to expose the metal line 150 by removing a portion of a pixel boundary of image sensing part 310. In embodiments, a portion of a pixel boundary of image sensing part 310 may be removed using fourth photoresist pattern 610 as an etching mask, thereby forming first trench T1 to expose metal line 150. In embodiments, a horizontal width of metal line 150 may be wider than that of image sensing part 310, such that a portion of metal line 150 may be exposed in a process for first trench T1. In embodiments, contact plug 330 may be formed at the sidewall of image sensing part 310 and may contact metal line 150.

Figure 17:
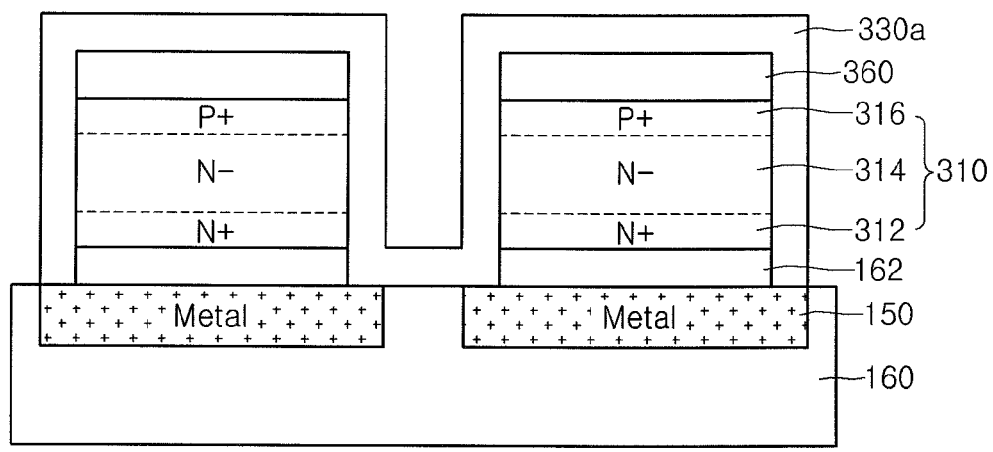
Figure 18:
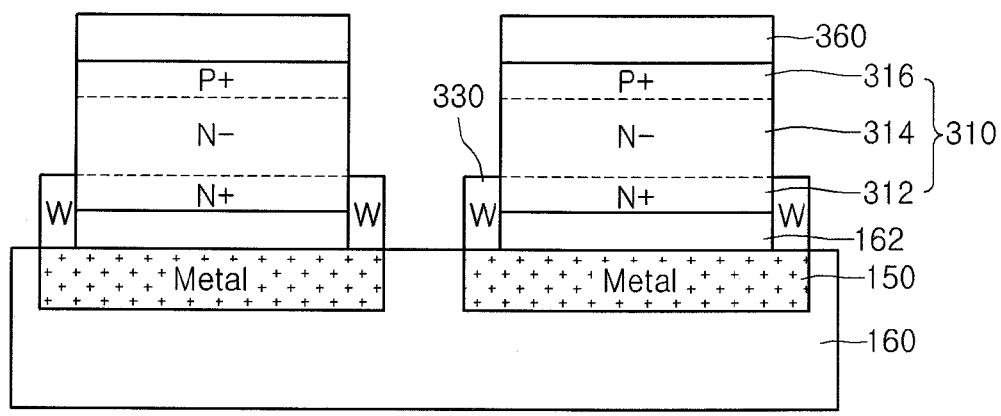

Referring to example FIG. 17, metal layer 330a may be filled on and/or over first trench T1. In embodiments, metal layer 330a may be formed while making contact with a sidewall of image sensing part 310. In embodiments, metal layer 330a may include tungsten having conductivity, but embodiments are not limited thereto. Referring to FIG. 18, a portion of metal layer 330a may be etched to form contact plug 330 at a sidewall of image sensing device 310. In embodiments, an etch back process may be performed with respect to metal layer 330a to form contact plug 330 at a sidewall of image sensing device 310, but embodiments are not limited thereto.

According to embodiments, contact plug 330 may be connected to high-concentration first conductive-type conductive layer 312 when contact plug 330 is formed. In embodiments, contact plug 330 may be connected to first conductive-type conductive layer 314. In embodiments, contact plug 330 may not make contact with second conductive-type conductive layer 316 and may minimize a short. In embodiments, contact plugs 330 may be connected to both sidewalls of image sensing part 310.

According to embodiments, an image sensor and a method for manufacturing an image sensor may include only one part that may be subject to a Si-etching process, in contrast to when two parts are subject to a Si-etching process. In embodiments, light loss may be reduced and dark current characteristics may be improved. In embodiments, a signal contact of an upper photodiode may be formed on and/or over a portion, which may be a substantially whole lower portion, of a pixel division area instead of a central portion of a pixel. In embodiments, a contact area may be maximized such that that resistance may be minimized. In embodiments, sensitivity of an image sensor may be maximized.

Figure 19:
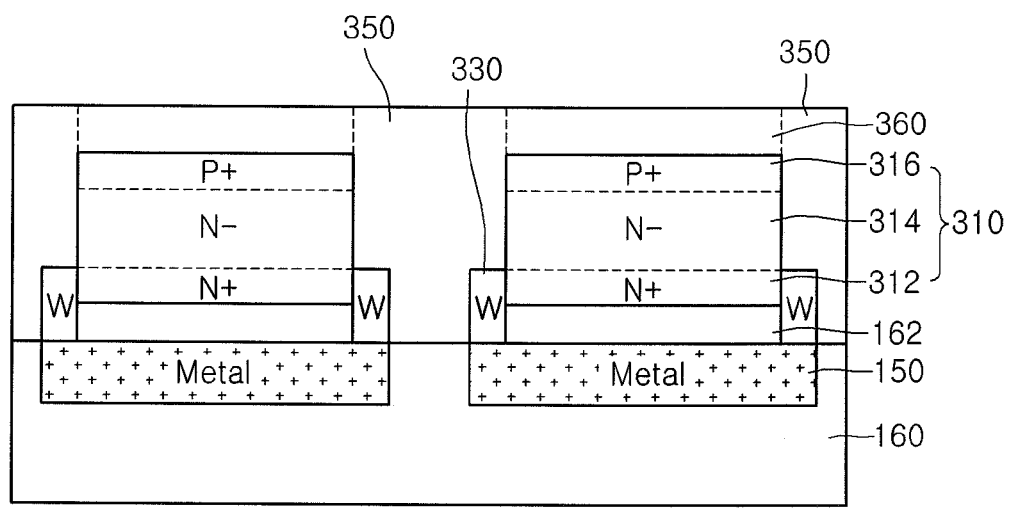
Figure 20:
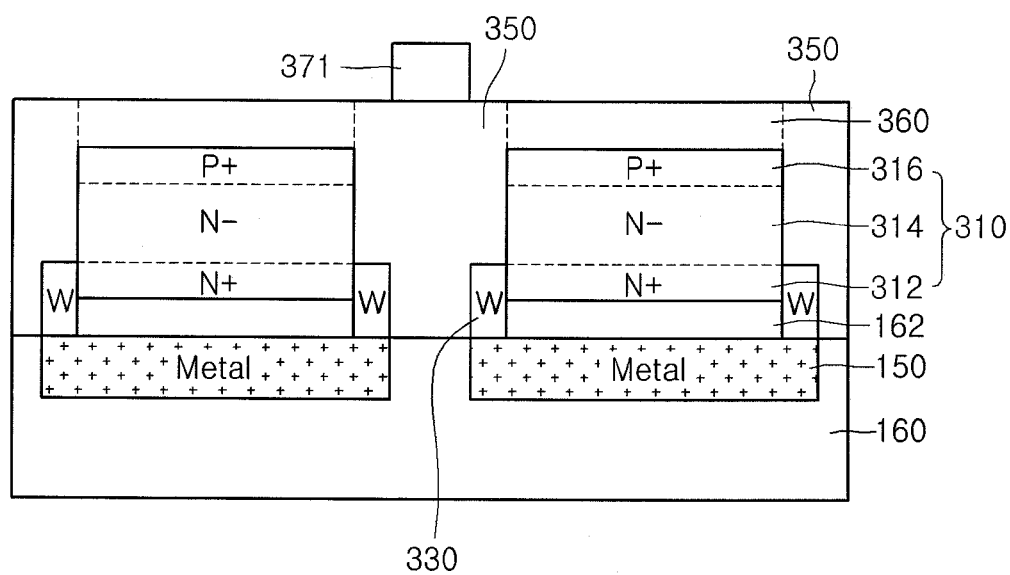

Referring to example FIG. 19, an insulating layer may be filled at a pixel boundary such that pixel division area 230 may be formed. Referring to FIG. 20, ground line 371 may be formed on and/or over pixel division area 350, for example using a metal layer. In embodiments, ground line 371 may be electrically connected to second conductive-type conductor 316 of image sensing part 310, for example through ground contact 373.

Figure 21:
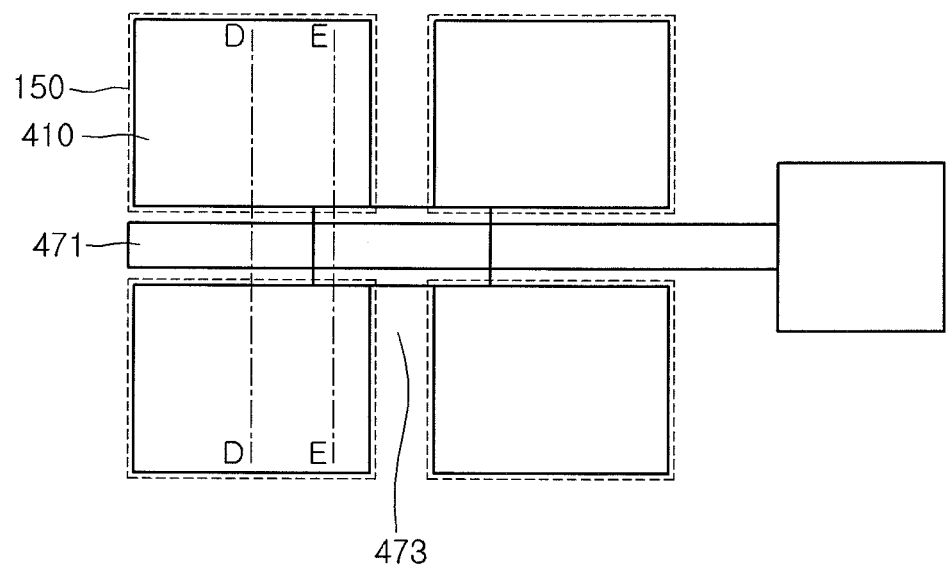
FIG. 21 is a plan view illustrating an image sensor an image sensor in accordance with embodiments.
Figure 22:
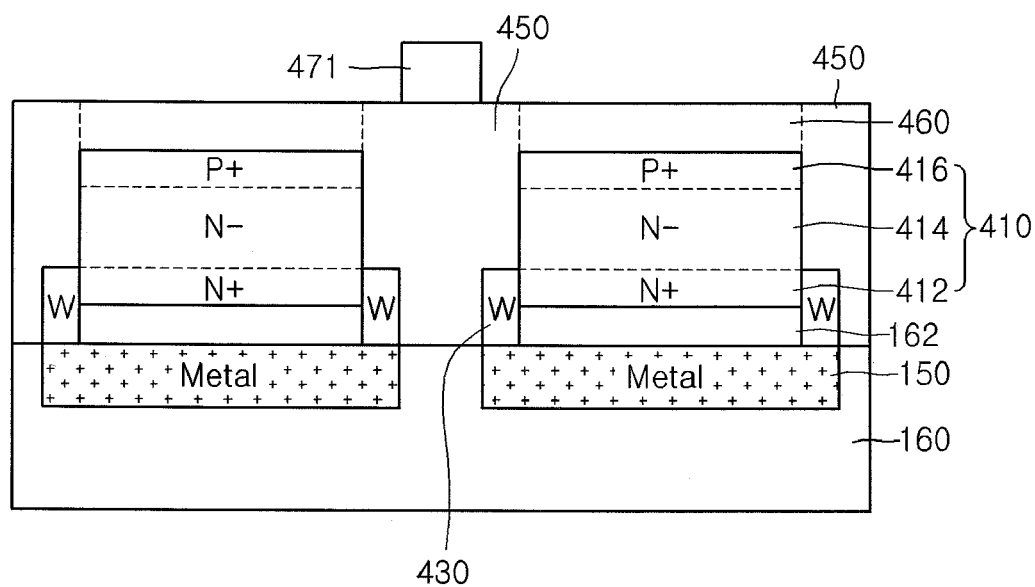
FIG. 22 is a sectional view taken along line D-D of an image sensor in accordance with embodiments.
Figure 23:
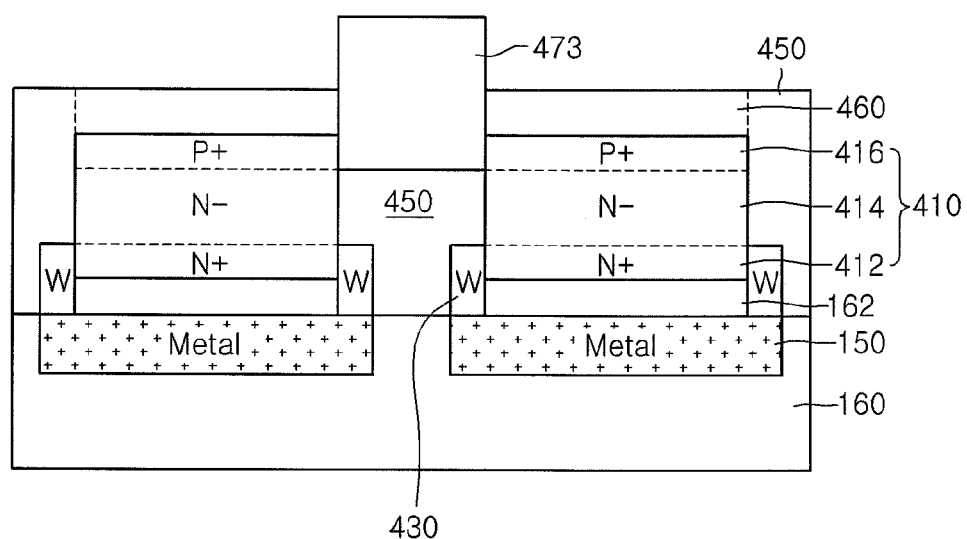
FIG. 23 is a sectional view taken along line E-E of an image sensor in accordance with embodiments.

Embodiments relate to an image sensor. Referring to example FIG. 21, a plan view illustrates an image sensor in accordance with embodiments. Referring to example FIG. 22, a sectional view taken along line D-D is illustrated. Referring to FIG. 23, a sectional view taken along line E-E is illustrated.

According to embodiments, an image sensor may include a readout circuitry formed on and/or over a first substrate. In embodiments, an image sensor may include a metal line 150. In embodiments, an image sensing part 410 may be formed on and/or over metal line 150. In embodiments, an image sensing part may include first conductive-type conductive layer 414 and/or second conductive-type conductive layer 416. In embodiments, contact plug 430 may be connected to sidewalls of image sensing part 410.

According to embodiments, an image sensor may include ground contact 473 formed on and/or over pixel division area 450 of image sensing part 410. In embodiments, a position of a ground contact formed on and/or over a photodiode for the purpose of ground-connection may be changed to a sidewall of a pixel division area. In embodiments, light loss caused by a ground contact may be minimized. In embodiments, formation of a signal line may be maximized.

According to embodiments, only one part may be subject to a Si-etching process in contrast to when two parts are subject to a Si-etching process. In embodiments, light loss may be minimized and dark current characteristics may be maximized. In embodiments, a signal contact of an upper photodiode may be formed over a portion, which may be a substantially whole lower portion, of a pixel division area instead of a central portion of a pixel. In embodiments, a contact area may be maximized such that resistance may be minimized. In embodiments, sensitivity of an image sensor may be maximized.

Figure 24:
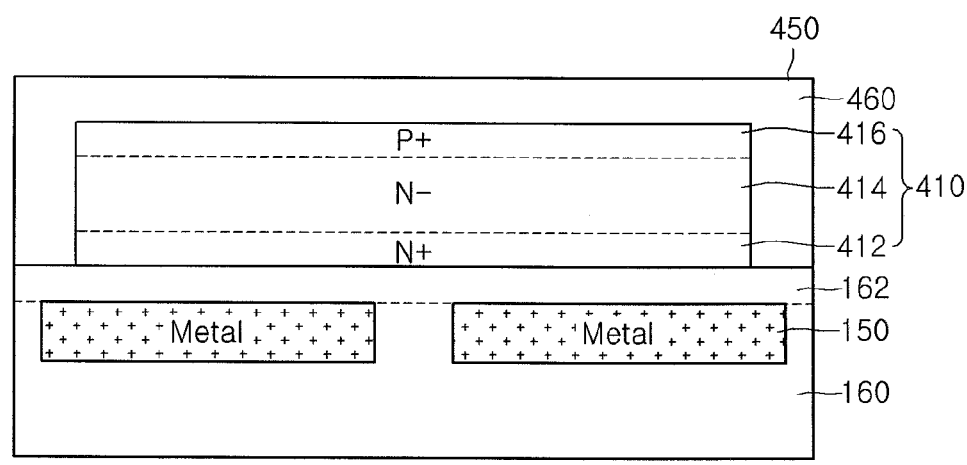
FIG. 24 to FIG. 32 are sectional views illustrating a method of manufacturing an image sensor in accordance with embodiments.

Embodiments relate to a method of manufacturing an image sensor. Referring to example FIG. 24, image sensing part 410 may be formed on and/or over metal line 150. According to embodiments, an image sensor may include a readout circuitry which may be formed on and/or over a first substrate. In embodiments, an image sensor may include metal line 150. In embodiments, a readout circuitry may include a transfer transistor, a reset transistor, a drive transistor and/or a select transistor, but embodiments are not limited thereto.

According to embodiments, a first interlayer dielectric layer 160 may be formed on and/or over a first substrate. In embodiments, line 150 may be electrically connected to a readout circuitry and may be formed on and/or over first interlayer dielectric layer 160. In embodiments, second interlayer dielectric layer 162 may be formed on and/or over metal line 150.

According to embodiments, a crystal semiconductor layer may be formed on and/or over a second substrate. In embodiments, first and/or second conductive-type conductive layers 414 and 416, respectively, may be formed for example through an ion implantation process. According to embodiments, high-concentration first conductive-type conductive layer 412 may be formed, for example under the first conductive-type conductive layer 214, and may serve as an ohmic contact layer.

According to embodiments, a first substrate may be bonded with a second substrate such that metal line 15 may correspond to image sensing device 410. In embodiments, second substrate may be removed from the resultant structure except for image sensing part 410. In embodiments, first insulating layer 460 may be formed on and/or over image sensing part 410.

Figure 25:
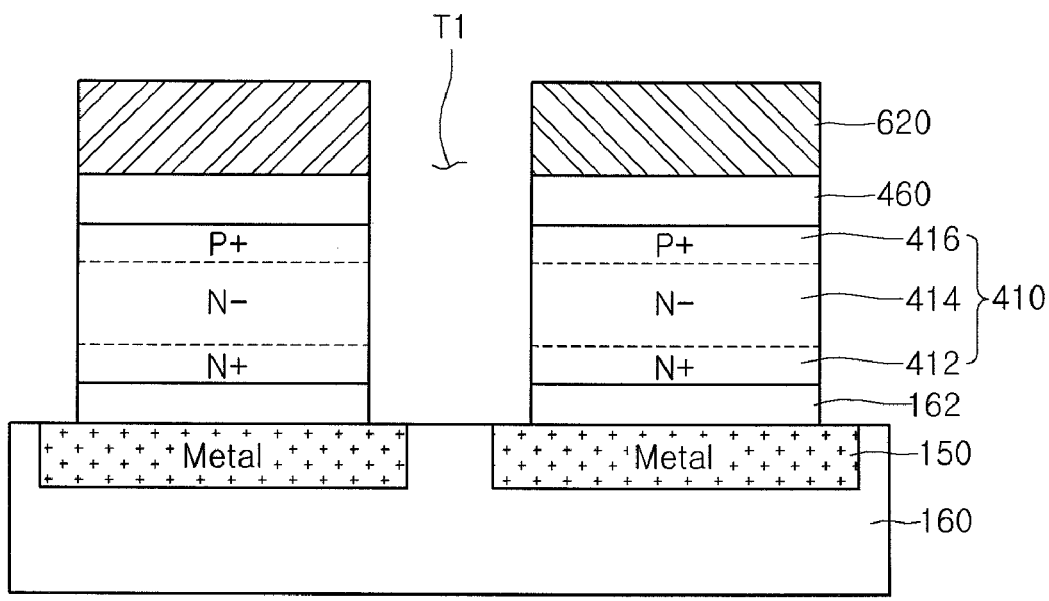

Referring to example FIG. 25, first trench T1 may expose metal line 150 and may be formed by removing a portion of a pixel boundary of image sensing part 410. In embodiments, first trench T1 may expose metal line 150 and may be formed by removing a portion of a pixel boundary of image sensing part 410 using fifth photoresist pattern 620 as an etching mask. In embodiments, a horizontal width of metal line 150 may be wider than that of image sensing part 410, such that a portion of metal line 150 may be exposed in a process for first trench T1. In embodiments, contact plug 430 may be formed at a sidewall of image sensing part 310 and may contact metal line 150.

Figure 26:
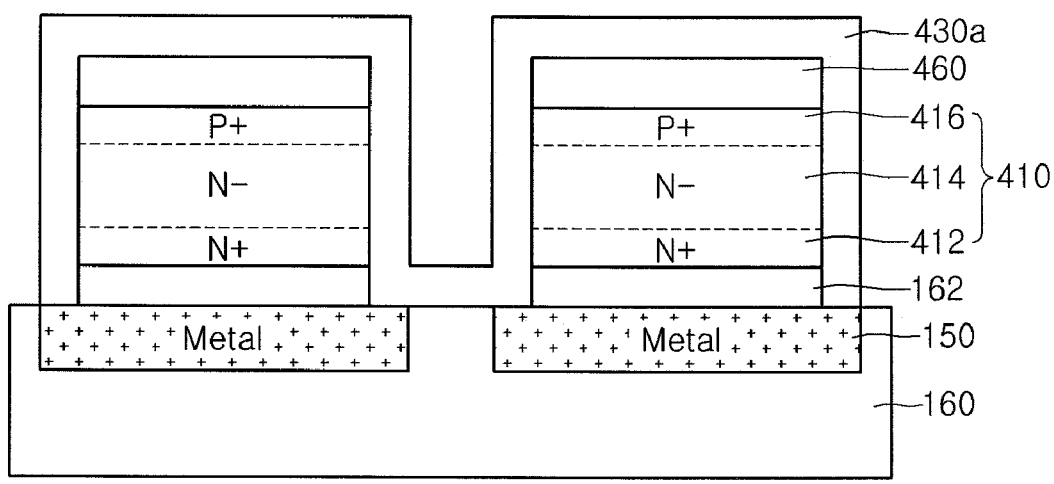

Referring to FIG. 26, metal layer 430a may be filled on and/or over first trench T1. In embodiments, metal layer 430a may be formed and may contact a sidewall of the image sensing part 410. In embodiments, metal layer 430a may include tungsten having conductivity, but embodiments are not limited thereto.

Figure 27:
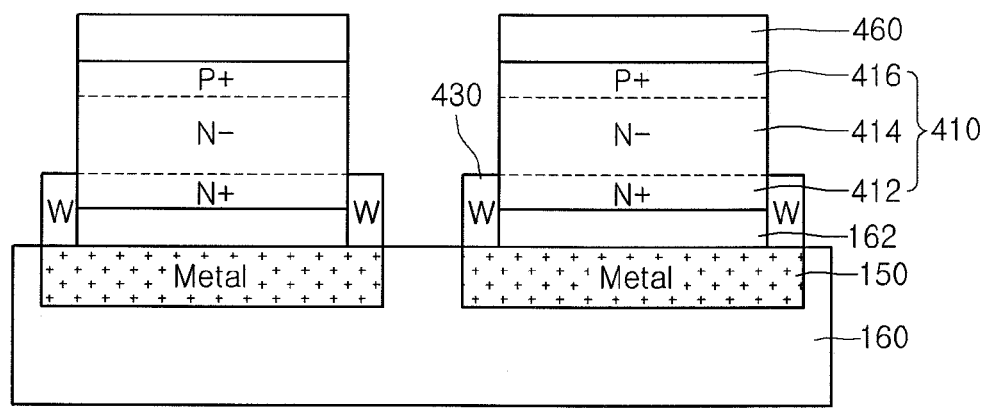

Referring to example FIG. 27, a portion of metal layer 430a may be etched to form contact plug 430 at a sidewall of image sensing device 410. In embodiments, an etch back process may be performed with respect to metal layer 430a to form contact plug 430 at a sidewall of image sensing device 410, but embodiments are not limited thereto.

According to embodiments, contact plug 430 may be connected to high-concentration first conductive-type conductive layer 412 when contact plug 430 is formed. In embodiments, contact plug 430 may be connected to first conductive-type conductive layer 414. In embodiments, contact plug 430 may not contact second conductive-type conductive layer 416 and may minimize a short. In embodiments, contact plugs 430 may be connected to both sidewalls of image sensing part 410.

According to embodiments, an image sensor and a method of manufacturing an image sensor may provide, only one part may be subject to a Si-etching process in contrast to when two parts are subject to a Si-etching process. In embodiments, light loss and dark current may be minimized. In embodiments, a signal contact of an upper photodiode may be formed on and/or over a portion, which may include a substantially whole lower portion, of a pixel division area instead of a central portion of a pixel. In embodiments, a contact area may be maximized such that resistance may be minimized. In embodiments, sensitivity of an image sensor may be maximized.

Figure 28:
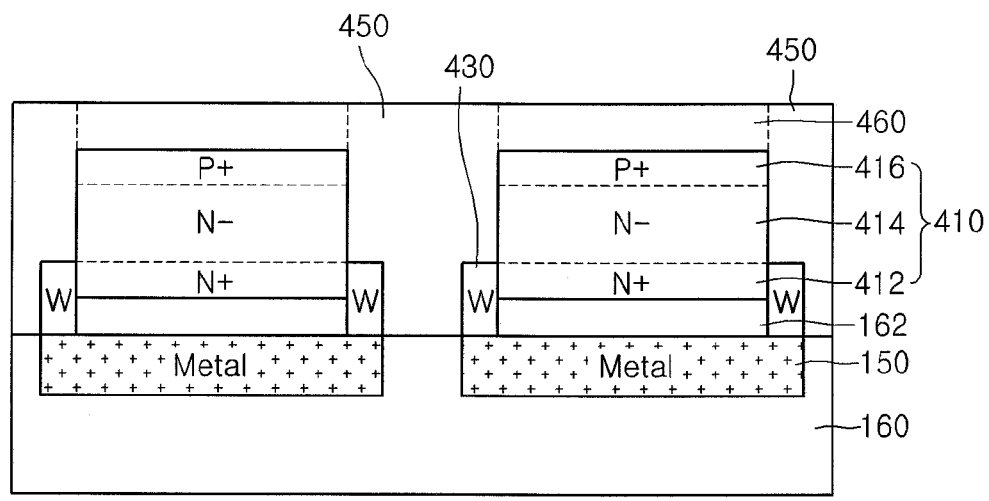
Figure 29:
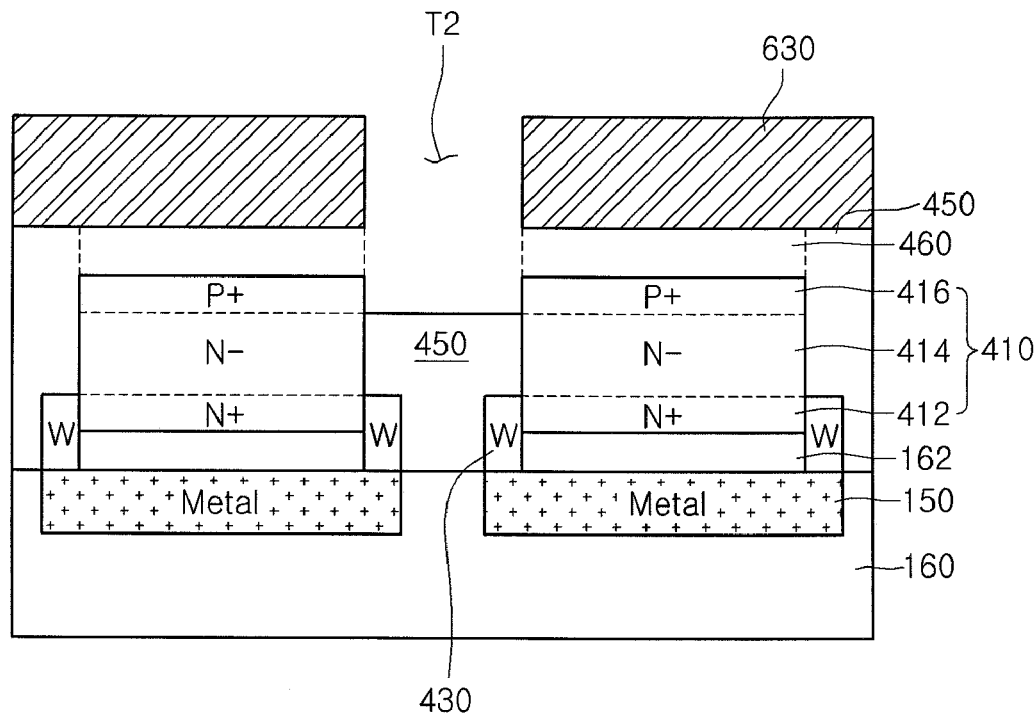

Referring to example FIG. 28, an insulating layer may be filled at a pixel boundary so that a pixel division area 450 may be formed. In embodiments, a ground line 471 may be formed on and/or over pixel division area 450, for example using a meal layer. Referring to example FIG. 29, a portion of pixel division area 450 may be removed, for example using sixth photoresist layer 630 as an etching mask. In embodiments, second trench T2 may be formed to expose a lateral side of second conductive-type conductive layer 416 of image sensing part 410. In embodiments, second trench T2 may expose a lateral side of second conductive-type conductive layer 416 such that first conductive-type conductive layer 414 may not be exposed to minimize a short.

Figure 30:
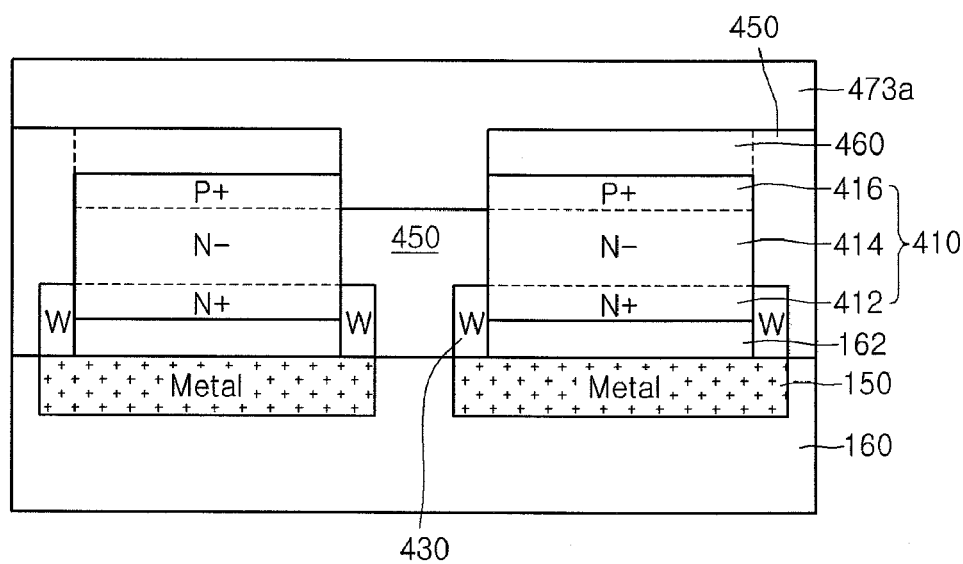
Figure 31:
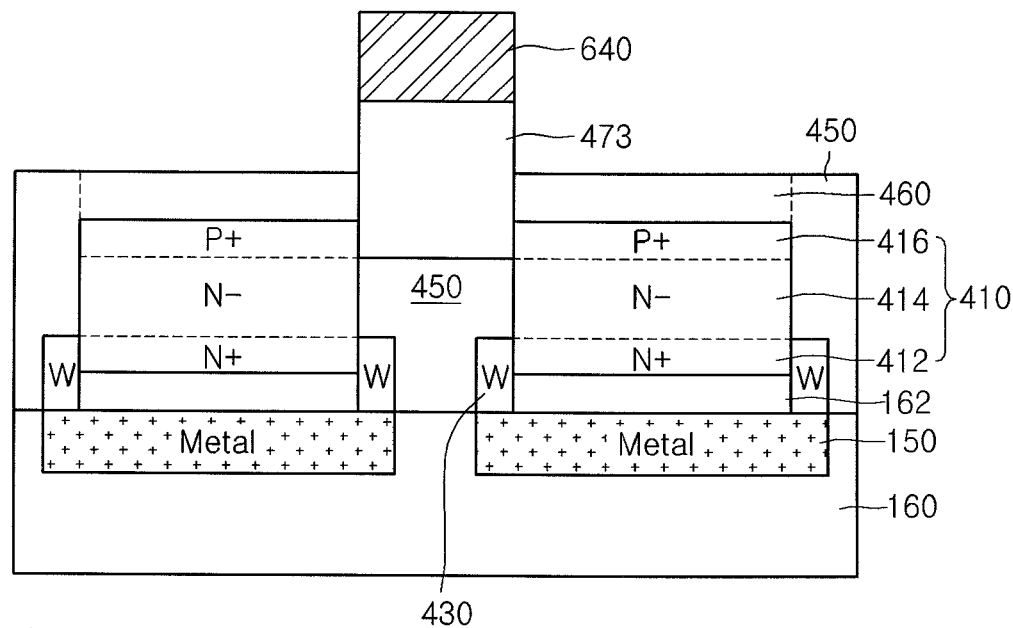
Figure 32:
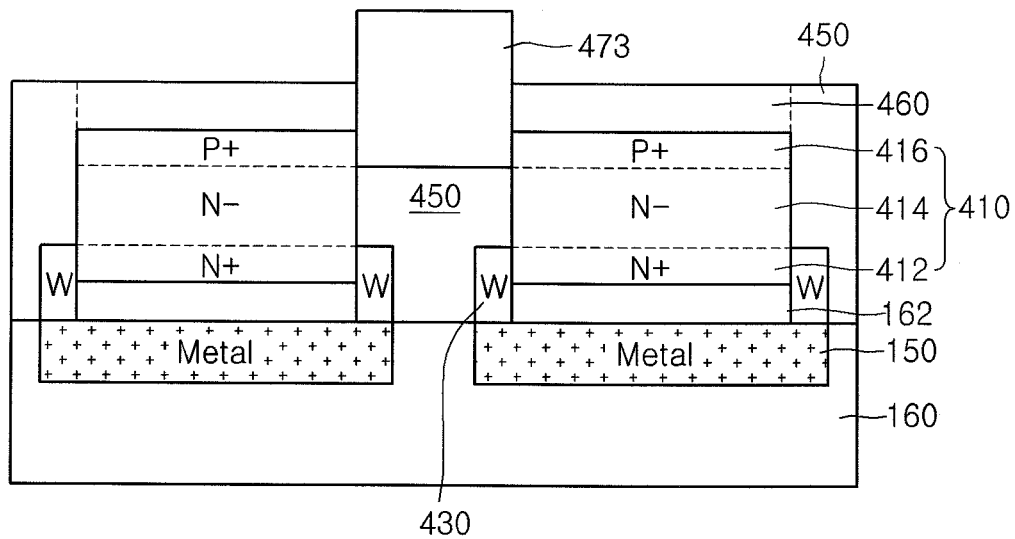

Referring to FIG. 30, sixth photoresist layer 630 may be removed. In embodiments, metal layer 473a may be formed on and/or over second trench T2. In embodiments, metal layer 473a may have conductivity and may be used for a ground contact. Referring to example FIG. 31, seventh photoresist layer 640, which may not expose metal layer 473a for a ground contact, may be formed on and/or over pixel division area 450. In embodiments, an exposed portion of metal layer 473a may be etched, for example using seventh photoresist layer 640 as an etching mask. In embodiments, ground contact 473 may be formed and may contact a lateral side of second-type conductive layer 416. Referring to example FIG. 32, seventh photoresist layer 640 may be removed such that ground contact 473 may be completed at a pixel boundary.

According to embodiments, an image sensor and a method of manufacturing an image sensor may include a position of a ground contact formed on and/or over a photodiode for the purpose of ground-connection which may be changed to a sidewall of a pixel division area. In embodiments, light loss caused by a ground contact may be minimized. In embodiments, formation of a signal line may be maximized.

According to embodiments, only one part may be subject to a Si-etching process in contrast to when two parts are subject to a Si-etching process. In embodiments, light loss and/or dark current may be minimized. In embodiments, a signal contact of an upper photodiode may be achieved by surrounding a portion, which may be a substantially whole lower portion, of a pixel division layer instead of a central portion of a pixel. In embodiments, a contact area may be maximize to minimize resistance. In embodiments, sensitivity of an image sensor may be maximized.

According to embodiments, a method of manufacturing an image sensor may include forming a readout circuitry on and/or over a first substrate. In embodiments, an image sensor may include a metal line. In embodiments, a method of manufacturing an image sensor may include forming an image sensing part. In embodiments, an image sensing part may include a first conductive-type conductive layer and/or a second conductive-type conductive layer which may be on and/or over a metal line. In embodiments, a method of manufacturing an image sensor may include forming a pixel division area formed on and/or over an image sensing part corresponding to a pixel boundary. In embodiments, a method of manufacturing an image sensor may include forming a ground contact on and/or over a pixel division area.

According to embodiments, forming a pixel division area on and/or over an image sensing part may include forming a first trench, for example by removing an image sensing part corresponding to a pixel boundary, and/or filling an insulating layer on and/or over a first trench. In embodiments, forming a ground contact may include removing a portion of a pixel division area to expose a lateral side of a second conductive-type conductive layer of an image sensing part, and/or forming a ground contact which may contact a lateral side of a second conductive-type conductive layer.

According to embodiments, forming a ground contact may include removing a portion of a pixel division area to form a second trench such that a lateral side of a second conductive-type conductive layer of an image sensing part may be exposed, and/or filling a metal layer on and/or over a second trench such that a metal layer contacts a lateral side of a second conductive-type conductive layer. In embodiments, a method of manufacturing an image sensor may include forming a third trench to expose a metal line by removing a portion of an image sensing part, and/or forming a contact plug by filling a metal layer on and/or over a third trench. In embodiments a metal layer of a third trench in contact with a second conductive-type conductive layer may be removed.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a readout circuitry including a metal line over a first substrate;
an image sensing part including a first conductive-type conductive layer and a second conductive-type conductive layer over said metal line;
a pixel division area over said image sensing part corresponding to a pixel boundary; and
a ground contact over said pixel division area.

2. The apparatus of claim 1, wherein said pixel division area comprises an insulating layer over a first trench formed by removing said image sensing part corresponding to said pixel boundary.

3. The apparatus of claim 1, wherein said ground contact comprises a metal layer over a second trench formed by removing a portion of said pixel division area to expose a lateral side of said second conductive-type conductive layer, wherein said ground contact contacts a lateral side of said second conductive-type conductive layer.

4. The apparatus of claim 1, comprising a contact plug over a third trench formed by removing a portion of said image sensing part to expose said metal line.

5. The apparatus of claim 4, wherein said contact plug contacts said first conductive-type conductive layer.

6. An apparatus comprising:
a readout circuitry including a metal line over a first substrate;
an image sensing part including a first conductive-type conductive layer and a second conductive-type conductive layer over said metal line; and
a contact plug connected with a sidewall of said image sensing part.

7. The apparatus claim 6, wherein said contact plug is connected to at least two sidewalls of said image sensing part.

8. The apparatus of claim 6, wherein said contact plug is connected to said first conductive-type conductive layer.

9. The apparatus of claim 6, wherein said metal line comprises a horizontal width wider than a horizontal width of said image sensing part.

10. The apparatus of claim 6, comprising a ground contact over a pixel division area of said image sensing part.

11. The apparatus of claim 10, wherein said ground contact contacts a lateral side of said second conductive-type conductive layer.

12. A method comprising:
forming a readout circuitry including a metal line over a first substrate;
forming an image sensing part including a first conductive-type conductive layer and a second conductive-type conductive layer over said metal line; and
forming a contact plug connected to a sidewall of said image sensing part.

13. The method of claim 12, wherein said contact plug is connected to at least two sidewalls of said image sensing part.

14. The method of claim 12, wherein said contact plug is connected to said first conductive-type conductive layer.

15. The method of claim 12, wherein forming said contact plug comprises:
   forming a first trench to expose said metal line by removing a portion of a pixel boundary of said image sensing part;
   forming a metal layer over said first trench; and
   etching a portion of said metal layer to form said contact plug at said sidewall.

16. The method of claim 15, wherein etching said portion of said metal layer comprises an etch-back process performed with respect to said metal layer such that said contact plug is formed at said sidewall of said image sensing part.

17. The method of claim 12, wherein said metal line comprises a horizontal width wider than a horizontal width of said image sensing part.

18. The method of claim 12, comprising forming a ground contact over a pixel division area of said image sensing part.

19. The method of claim 18, wherein forming said ground contact comprises:
   removing a portion of said pixel division area to expose a lateral side of said second conductive-type conductive layer; and
   forming said ground contact contacting said lateral side of said second conductive-type conductive layer.

20. The method of claim 18, wherein forming said ground contact comprises:
   forming a second trench by removing a portion of said pixel division area to expose a lateral side of said second conductive-type conductive layer; and
   filling a metal layer over said second trench such that said ground contact contacts said lateral side of said second conductive-type conductive layer.

* * * * *